United States Patent [19]
Ochi

[11] Patent Number: 5,886,360
[45] Date of Patent: Mar. 23, 1999

[54] SEMICONDUCTOR DEVICE

[75] Inventor: Seiji Ochi, Tokyo, Japan

[73] Assignee: Mitsubishi Denki Kabushiki Kaisha, Tokyo, Japan

[21] Appl. No.: 663,636

[22] Filed: Jun. 14, 1996

[30] Foreign Application Priority Data

Nov. 24, 1995 [JP] Japan .................................... 7-305496

[51] Int. Cl.$^6$ ................................................ H01L 29/06
[52] U.S. Cl. ................................ 257/15; 257/14; 257/22; 257/628
[58] Field of Search ................................ 257/14, 15, 17, 257/18, 22, 201, 627, 628

[56] References Cited

U.S. PATENT DOCUMENTS

| | | | |
|---|---|---|---|
| 5,126,804 | 6/1992 | Nagai et al. | 357/17 |
| 5,436,468 | 7/1995 | Nakata et al. | 257/15 |
| 5,530,713 | 6/1996 | Fukagai | 372/45 |
| 5,561,080 | 10/1996 | Ishibashi et al. | 437/129 |
| 5,663,592 | 9/1997 | Miyazawa et al. | 257/627 |

OTHER PUBLICATIONS

Gomyo et al., "Observation Of Strong Ordering In $Ga_xIn_{1-x}P$ Alloy Semiconductors", Physical Review Letters, Jun. 20, 1988, pp. 2645–2648.

Suzuki et al., "Strong Ordering in GaInP Alloy Semiconductors: Formation Mechanism For The Ordering Phase", Journal of Crystal Growth, vol. 93, 1988, pp. 396–405.

Extended Abstracts (The 38th Spring Meeting, 1991), The Japan Society of Applied Physics and Related Societies, No. 1, 30a–ZG–5.

Extended Abstracts (The 40th Fall Meeting, 1991), The Japan Society of Applied Physics and Related Societies, No. 1 27p–ZS–9.

Extended Abstracts (The 41st Spring Meeting, 1994), The Japan Society of Applied Physics and Related Societies, No. 1, 28p–S–9.

Extended Abstracts (The 41st Spring Meeting, 1994), The Japan Society of Applied Physics and Related Societies, No. 1, 28a–Y–10.

Extended Abstracts (The 42nd Spring Meeting, 1995), The Japan Society of Applied Physics and Related Societies, No. 1, 29a–SZY–9.

Extended Abstracts (The 42nd Spring Meeting, 1995), The Japan Society of Applied Physics and Related Societies, No. 1, 29a SZY–10.

Colas et al., "Generation Of Macroscopic Steps On Patterned (100) Vicinal GaAs Surfaces", Applied Physics Letters, vol. 55. No. 9, 1989, pp. 867–869.

Fukui et al., "Natural Superstep Formed On GaAs Vicinal Surface by Metalorganic Chemical Vapor Deposition", Japanese Journal of Applied Physics, vol. 29, No. 3, 1990, pp. L483–L485.

Primary Examiner—Tom Thomas
Assistant Examiner—Ori Nadav
Attorney, Agent, or Firm—Leydig, Voit & Mayer

[57] ABSTRACT

A semiconductor device includes a semiconductor substrate; a semiconductor laminated structure including a first barrier layer, a conduction layer including a natural superlattice, and a second barrier layer, disposed on the semiconductor substrate. The first barrier layer, the conduction layer, and the second barrier layer produce heterojunctions that confine charge carriers within the conduction layer. The first barrier layer has steps at the surface contacting the conduction layer, the steps including, alternatingly arranged, a first crystal plane having a first orientation and a second crystal plane having a second orientation. The conduction layer includes first portions where the natural superlattice is ordered and second portions where the natural superlattice is disordered, the first and second portions being disposed on the first and second crystal planes, respectively. The degree of order in the conduction layer is higher in the first portions than in the second portions. Thus, the band gap energy of the conduction layer is lower in the first portions than in the second portions, and charge carriers are confined within the first portions by the second portions. As a result, a semiconductor device in which the first portions function as high-performance quantum wires is realized.

11 Claims, 7 Drawing Sheets bottom of conduction band top of valence band

SEMICONDUCTOR DEVICE

FIELD OF THE INVENTION

The present invention relates to a semiconductor device including a quantum wire structure providing one-dimensional conduction of charge carriers and, more particularly, to a quantum wire structure having a natural superlattice in which the degree of order of the superlattice is changed periodically. The invention also relates to a method of producing the quantum wire structure.

BACKGROUND OF THE INVENTION

A prior art semiconductor device including a quantum wire structure was reported in Applied Physics Letters, Vol. 55, pp.867–869 (1989). FIG. 14 is a cross-sectional view illustrating the quantum wire structure of the prior art semiconductor device. In the figure, reference numeral 100 designates a GaAs substrate having a surface in a plane that is 6° off the (100) plane in the [110] ((111)A) direction. The GaAs substrate 100 has a periodic pattern of grooves 110 at the surface. The interval of the grooves 110 ranges from several microns to several tens of microns. A GaAs layer 200 is disposed on the GaAs substrate 100. The GaAs layer 200 has macroscopic steps opposite the grooves 110 of the GaAs substrate 100. A GaAs layer 300 is disposed on the GaAs layer 200 having the macroscopic steps. Portions of the GaAs layer 300 opposed to the macroscopic steps of the GaAs layer 200 are thicker than other portions. An AlGaAs layer 400 is disposed on the GaAs layer 300. A GaAs layer 500 is disposed on the AlGaAs layer 400. The AlGaAs layer 400 and the GaAs layer 500 are thicker in portions opposed to the macroscopic steps of the GaAs layer 200 than in other portions. An AlGaAs layer 600 is disposed on the GaAs layer 500.

A description is given of a method of producing the quantum wire structure.

Initially, a GaAs substrate 100 having a surface in a plane that is 6° off from the (001) plane in the [110] ((111)A) direction is prepared, and a periodic pattern of grooves 110 are formed at the surface of the GaAs substrate 100. Thereafter, a GaAs layer 200 is grown on the surface of the GaAs substrate 100 by MOCVD (Metal Organic Chemical Vapor Deposition). In the crystal growth, atomic layer steps are bunched (step bunching) on the grooves 110, producing macroscopic steps at the surface of the GaAs layer 200. As a result, the GaAs layer 200 has a surface configuration in which the macroscopic steps and the (001) plane are alternatingly arranged. Thereafter, a GaAs layer 300, an AlGaAs layer 400, a GaAs layer 500, and an AlGaAs layer 600 are successively grown on the GaAs layer 200, completing a quantum wire structure as shown in FIG. 14.

A description is given of the operation of the semiconductor device having the quantum wire structure shown in FIG. 14.

Since the growth rate of GaAs is higher on the macroscopic steps than on the (001) plane, the GaAs layer 500 that is sandwiched between the AlGaAs layer 400 and the AlGaAs layer 600 has relatively thick portions 510 opposite the macroscopic steps and relatively thin portions 520 opposite the (001) plane. Therefore, the GaAs layer 500 conducts charge carriers in the relatively thick portions 510 on the macroscopic steps. As a result, in the GaAs layer 500, pseudo quantum wire structures are produced by the portions 510 extending in the direction perpendicular to the cross-section of FIG. 14.

Meanwhile, a semiconductor device including a quantum wire structure that is produced without previous patterning of a substrate is disclosed in, Japanese Journal of Applied Physics, Vol.29, pp.L483–L485 (1990) or Extended Abstracts (The 41st Spring Meeting, 1994); The Japan Society of Applied Physics and Related Societies, No. 28p-S-9. FIG. 15 is a cross-sectional view illustrating the quantum wire structure of the prior art semiconductor device. In the figure, the same reference numerals as those shown in FIG. 14 designate the same or corresponding parts. In the fabrication, initially, a GaAs substrate (not shown) having a surface in a plane that is slightly off the (001) plane in the [$\bar{1}$10] direction is prepared. When a GaAs layer 200 is grown on the surface of the substrate by MOCVD, atomic layer steps are bunched to produce a multiatomic step on the GaAs layer 200. Thereafter, An AlGaAs layer 400, a GaAs layer 500, and an AlGaAs layer (not shown) are successively grown on the GaAs layer 200 to produce an AlGaAs/GaAs/AlGaAs quantum well structure.

Also, in the quantum well structure shown in FIG. 15, since the growth rate of the GaAs layer 500 is higher on the multiatomic step than on the (001) plane, the GaAs layer 500 has a relatively thick portion 510 opposite the multiatomic step and a relatively thin portion 520 opposite the (001) plane. The relatively thick portion 510 provides a pseudo quantum wire structure for conducting charge carriers.

In the prior art semiconductor devices shown in FIGS. 14 and 15, since the quantum wire structure is produced by growing the GaAs layer 500 utilizing the dependence of the growth rate of GaAs on the surface orientation, the GaAs layer 500, that is, the relatively thin portion 520, is formed on the (001) plane of the AlGaAs layer 400. This portion 520 also provides a GaAs quantum well sandwiched by the AlGaAs layers 400 and 600. Therefore, in the quantum well structure 510, sufficient confinement of charge carriers is not realized.

Furthermore, the material of the layer 500 providing a quantum wire structure is restricted to a material having a high dependence of the growth rate on the surface orientation.

In the prior art semiconductor device shown in FIG. 14, since the substrate 100 has the periodic grooves 110 at the surface, the interval between adjacent grooves 110 is restricted by patterning of the grooves, so that the density of quantum wires within the surface of the substrate cannot be increased. In addition, the patterning of the grooves 110 complicates the fabrication process.

SUMMARY OF THE INVENTION

It is an object of the present invention to provide a semiconductor device having a quantum wire structure that realizes satisfactory quantum confinement of charge carriers in a direction parallel to the surface of the substrate.

It is another object of the present invention to provide a relatively simple method for producing the semiconductor device.

Other objects and advantages of the invention will become apparent from the detailed description that follows. The detailed description and specific embodiments described are provided only for illustration since various addition and modifications within the scope of the invention will be apparent to those of skill in the art from the detailed description.

According to a first aspect of the present invention, a semiconductor device comprises a semiconductor substrate having opposed first and second surfaces surface; a semiconductor laminated structure comprising a first barrier layer, a conduction layer including a natural superlattice, and a second barrier layer disposed on the first surface of the semiconductor substrate in this order, wherein the first barrier layer, the conduction layer, and the second barrier layer produce heterojunctions that confine charge carriers within the conduction layer in the direction perpendicular to first surface of the substrate; the first barrier layer having a plurality of steps at the surface contacting the conduction layer, the steps being composed of, alternatingly arranged, first crystal planes having a first orientation and second crystal planes having a second orientation different from the first orientation; and the conduction layer including first portions wherein the natural superlattice is regularly ordered and second portions wherein the natural superlattice is disordered, the first portions and the second portions being disposed on the first crystal planes and the second crystal planes, respectively. Therefore, in the conduction layer, the degree of order of the natural superlattice is higher in the first portions than in the second portions, so that the band gap energy of the conduction layer is lower in the first portions than in the second portions, whereby charge carriers are confined within the first portions by the second portions in the direction of the alternating arrangement of these first and second portions. As a result, a semiconductor device in which the first portions function as high-performance quantum wires is realized.

According to a second aspect of the present invention, in the above-described semiconductor device, the semiconductor substrate has a surface that is off from a crystal plane toward another crystal plane. Therefore, the above-described quantum wire structure in the conduction layer is easily realized.

According to a third aspect of the present invention, in the above-described semiconductor device, the first barrier layer and the second barrier layer comprise AlGaInP having an Al composition, and the conduction layer comprises InGaP layer or AlGaInP having an Al composition smaller than the Al composition of the AlGaInP barrier layers. Since the InGaP conduction layer has a band gap energy smaller than that of the AlGaInP barrier layers, charge carriers are confined within the InGaP conduction layer. Further, in the conduction layer, since charge carriers are confined within the first portions by the second portions in the direction of the alternating arrangement of these first and second portions, resulting in a semiconductor device in which the first portions function as high-performance quantum wires.

According to a fourth aspect of the present invention, the first barrier layer and the second barrier layer comprise AlAsSb, and the conduction layer comprises AlInAs. Since the AlInAs conduction layer has a band gap energy smaller than that of the AlAsSb barrier layers, charge carriers are confined within the conduction layer. Further, in the conduction layer, since charge carriers are confined within the first portions by the second portions in the direction of the alternating arrangement of these first and second portions, resulting in a semiconductor device in which the first portions function as high-performance quantum wires.

According to a fifth aspect of the present invention, in the above-described semiconductor device, the conduction layer is provided in plural stages. Therefore, in addition to the above-described effects, the density of the quantum wires can be increased.

According to a sixth aspect of the present invention, in the above-described semiconductor device, the first portions of the conduction layer are thicker than the second portions thereof. Also in this case, in the conduction layer, the degree of order of the natural superlattice is higher in the first portions than in the second portions, so that the band gap energy of the conduction layer is lower in the first portions than in the second portions, whereby charge carriers are confined within the first portions by the second portions in the direction of the alternating arrangement of these first and second portions. As a result, a semiconductor device in which the first portions function as high-performance quantum wires is realized.

According to a seventh aspect of the present invention, in the above-described semiconductor device, the semiconductor substrate has grooves at first surface. Therefore, the steps of the first barrier layer are formed opposite the grooves of the substrate. Also in this case, charge carriers are confined within the first portions of the conduction layer by the second portions, in the direction of the alternating arrangement of these first and second portions, resulting in a semiconductor device in which the first portions function as high-performance quantum wires.

According to an eighth aspect of the present invention, the above-described semiconductor device further includes a first electrode disposed on the second surface, and a second electrode disposed on the second barrier layer. In this structure, since charge carriers are confined within the first portions of the conduction layer where the natural superlattice is regularly ordered, a high-performance semiconductor laser that can oscillate with a low current density is realized.

According to a ninth aspect of the present invention, the above-described semiconductor device further comprises a source electrode and a drain electrode disposed on one of the first portions wherein the natural superlattice is regularly ordered, and a gate electrode disposed on a part of the second barrier layer between the source electrode and the drain electrode. In this structure, since charge carriers move only in the first portion of the conduction layer where the natural superlattice is regularly ordered, when the source electrode and the drain electrode are disposed along the longitudinal direction of the first portion, the first portion can be used as a one-dimensional channel region. As a result, a field effect transistor having a high electron mobility is realized.

According to a tenth aspect of the present invention, a method of fabricating the above-described semiconductor device comprises growing the first barrier layer on the semiconductor substrate, forming a plurality of steps at the surface of the barrier layer so that the steps are composed of, alternatingly arranged, first crystal planes having a first orientation and second crystal planes having a second orientation different from the first orientation; growing the conduction layer on the steps of the first barrier layer so that the conduction layer has first portions wherein the natural superlattice is regularly ordered and second portions wherein the natural monolayer superlattice is disordered, the first portions and the second portions being grown on the first crystal planes and the second crystal planes of the first barrier layer, respectively; and growing the second barrier layer on the conduction layer. In this method, since the first barrier layer is grown under the step bunching condition, the steps, i.e., the alternating first crystal planes and second crystal planes having different orientations, are produced at the surface of the first barrier layer. The conduction layer grown on the steps of the first barrier layer has first portions wherein the natural superlattice is regularly ordered and second portions wherein the natural superlattice is disordered, opposite the first crystal planes and second crystal planes, respectively. In the semiconductor device so produced, since the band gap energy of the first portions is smaller than that of the second portions, charge carriers are confined within the first portions by the second portions in the direction of the alternating arrangement of these first and second portions, resulting in a semiconductor device in which the first portions function as high-performance quantum wires.

According to an eleventh aspect of the present invention, in the above-described method, the semiconductor substrate has a surface in a crystal plane that is off from the (001) plane in the [110] direction, the first crystal plane is the (001) plane, and the second crystal plane is a plane that is off from the (001) plane in the [110] direction. Since the natural monolayer superlattice of the conduction layer is higher in the first portions grown on the first crystal plane than in the second portions grown on the second crystal plane, so that the band gap energy of the conduction layer is lower in the first portions than in the second portions. Therefore, charge carriers are confined within the first portions by the second portions in the direction of the alternating arrangement of these first and second portions, resulting in a semiconductor device in which the first portions function as high-performance quantum wires.

According to a twelfth aspect of the present invention, in the above-described method, the semiconductor substrate has a surface in a crystal plane that is off from the (001) plane in the [1̄10] direction, the first crystal plane is a plane that is off from the (001) plane in the [1̄10] direction, and the second crystal plane is the (001) plane. Also in this case, the same effects as described above are achieved.

DETAILED DESCRIPTION OF THE PREFERRED EMBODIMENTS

Figure 1:
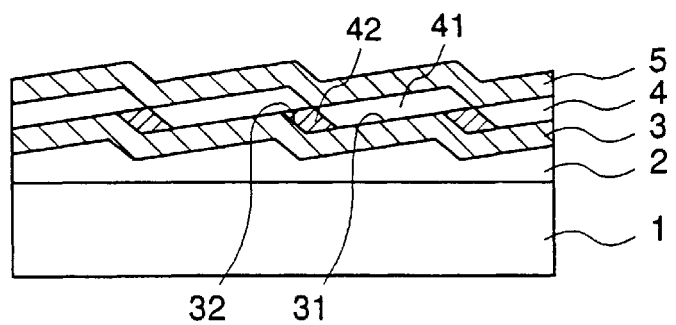
FIG. 1 is a cross-sectional view illustrating a quantum wire structure according to a first embodiment of the present invention.

FIG. 1 is a cross-sectional view illustrating a quantum wire structure in accordance with a first embodiment of the present invention. The cross-section is viewed from the <110> direction, perpendicular to the [110] direction. The semiconductor device includes a GaAs substrate 1 having a surface in a plane that is 3°–5° off the (001) plane in the [110] direction. A GaAs layer 2 about 0.5 μm thick is disposed on the surface of the GaAs substrate 1. The GaAs layer 2 has periodic steps at the surface. An AlGaInP layer 3 serving as a first barrier layer is disposed on the GaAs layer 2. The AlGaInP layer 3 is about 0.3 μm thick and has periodic steps corresponding to the periodic steps of the GaAs layer 2, at the surface. Each step is formed between the (001) plane (first crystal plane 31) and a plane that is about 10° off the (001) plane in the [110] direction (second crystal plane 32). The interval of the steps ranges from several hundreds of angstroms to 1 micron. An InGaP layer 4 serving as a conduction layer is disposed on the AlGaInP layer 3. The InGaP layer 4 has a band gap energy smaller than that of the AlGaInP layer 3. The InGaP layer 4 is about 0.1 μm thick and comprises a crystalline layer having a naturally occurring superlattice at an atomic level that has come to be known in the scientific literature as a monolayer superlattice. For example, see Suzuki et al., Journal of Crystal Growth, volume 93, pages 396–405 (1988). The concept of a monolayer supperlatice is further explained below with respect to FIGS. 12 and 13. Hereafter, this monolayer superlattidce is sometimes referred to simply as a superlattice. The degree of order of the natural superlattice in the InGaP layer 4 is higher in a portion 41 opposite the first crystal plane 31 of the AlGaInP layer 3 than in a portion 42 opposite the second crystal plane 32 of the AlGaInP layer 3. An AlGaInP layer 5 serving as a second barrier layer is disposed on the InGaP layer 4. The AlGaInP layer 5 is about 0.3 μm thick and has a band gap energy larger than that of the InGaP layer 4.

FIGS. 2(a)–2(e) are cross-sectional views illustrating process steps in a method of fabricating the semiconductor device shown in FIG. 1.

Figure 2:
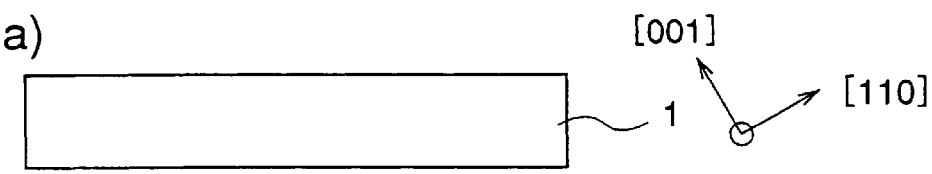
FIGS. 2(a)–2(e) are cross-sectional views illustrating process steps in a method of fabricating the quantum wire structure shown in FIG. 1.
Figure 2:
Figure 2:
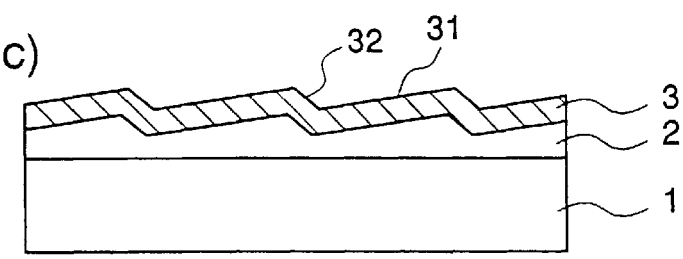
Figure 2:
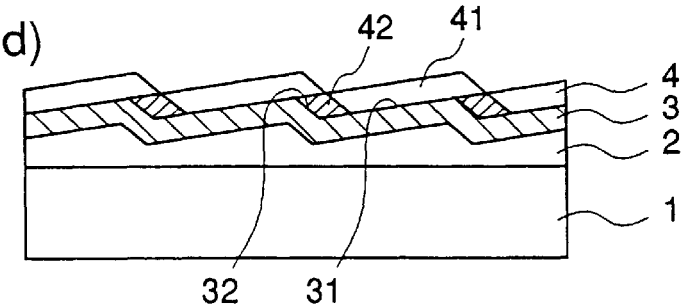
Figure 2:
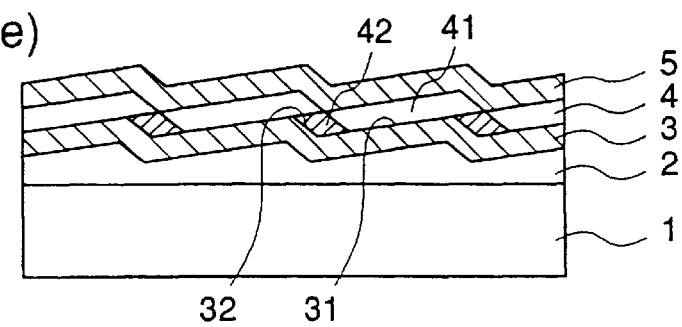

Initially, a GaAs substrate 1 having a surface in a plane that is 3°~5° off the (001) plane in the [110] direction is prepared (FIG. 2(a)). The above-described semiconductor layers are successively grown on the GaAs substrate 1 by MOCVD. More specifically, first of all, GaAs is grown on the GaAs substrate 1 at a growth temperature of 600° C. to form the GaAs layer 2 (FIG. 2(b)). In this growth, atomic layer steps on the surface of the substrate 1 are bunched (step bunching), thereby producing multiatomic steps at the surface of the GaAs layer 2. As a result, the GaAs layer 2 has a surface configuration in which the (001) plane and the plane that is about 10° off the (001) plane in the [110] direction are periodically and alternatingly arranged. These two planes extend straight in the direction perpendicular to the cross section of FIG. 2(b). Although the GaAs layer 2 is grown at 600° C., the growth temperature is not restricted thereto.

In the step of FIG. 2(c), $Al_{0.25}Ga_{0.25}In_{0.5}P$ is grown on the GaAs layer 2 at a growth temperature of 650° C. to produce the AlGaInP first barrier layer 3 that lattice-matches with the GaAs substrate 1. The surface configuration of the AlGaInP layer 3 after the growth is basically identical to the surface configuration of the GaAs layer 2. That is, the AlGaInP layer 3 has a surface configuration in which the (001) plane (first crystal plane 31) and the plane that is about 10° off the (001) plane in the [110] direction (second crystal plane 32) are periodically and alternatingly arranged.

In the step of FIG. 2(d), $In_{0.5}Ga_{0.5}P$ is grown on the AlGaInP layer 3 at a growth temperature of 660° C. and a V/III ratio of 140, producing the InGaP conduction layer 4. In the InGaP layer 4 so grown, a natural monolayer superlattice in which Ga atoms and In atoms are regularly arranged is produced. The band gap energy of the InGaP conduction layer 4 is smaller than the band gap energy of the AlGaInP first barrier layer 3. The degree of order of the natural monolayer superlattice in the InGaP layer 4 is higher in the portion 41 grown on the first crystal plane 31 of the AlGaInP layer 3 than in the portion 42 grown on the second crystal plane 32 of the AlGaInP layer 3. Therefore, in the InGaP layer 4, the band gap energy of the portion 41 on the first crystal plane 31 is smaller than the band gap energy of the portion 42 on the second crystal plane 32. The growth condition of the InGaP layer 4 is not restricted to the above-described condition.

Finally, $Al_{0.25}Ga_{0.25}In_{0.5}P$ is grown on the InGaP layer 4 at a growth temperature of 650° C. to produce the AlGaInP layer 5 having a band gap energy larger than that of the InGaP layer 4, completing an AlGaInP/InGaP/AlGaInP quantum well structure as shown in FIG. 2(e).

Generally, in a ternary system compound semiconductor or a quarternary system compound semiconductor including two or more group III elements, such as InGaP and AlGaInP, respectively, a natural monolayer superlattice is produced because the group III elements of different kinds are periodically arranged during the crystal growth of the compound semiconductor. When such a natural monolayer superlattice is produced, the energy band structure is changed according to the periodic arrangement of the group III elements, that is, the band gap energy decreases with an increase in the degree of order of the periodic arrangement of the group III elements.

Figure 12:
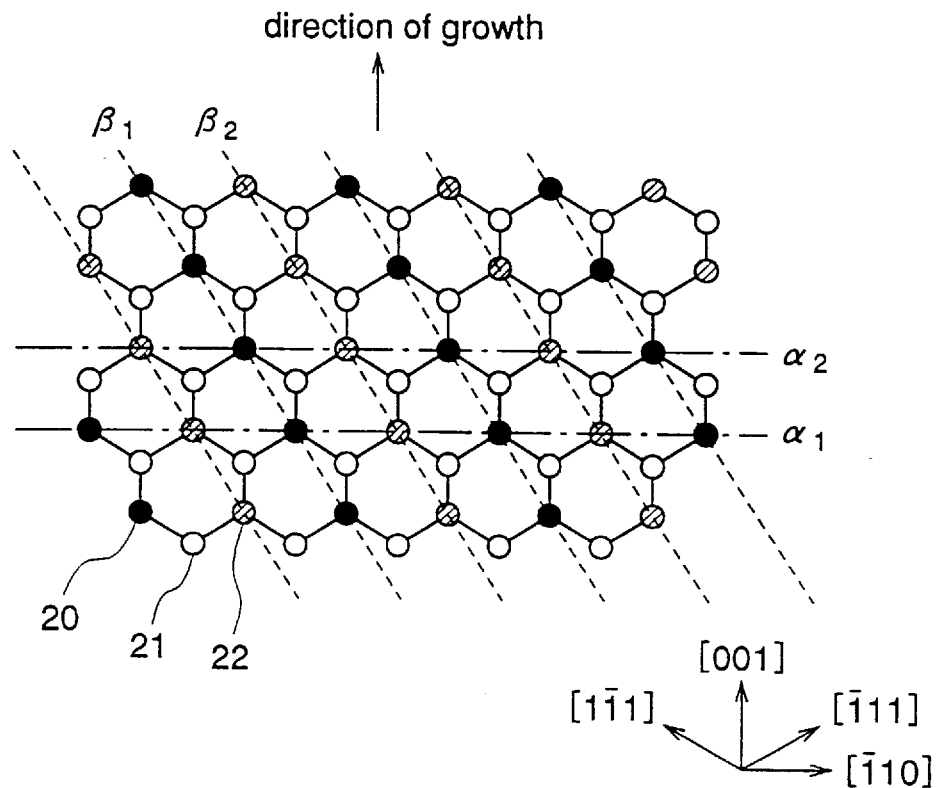
FIG. 12 is a diagram illustrating an atomic arrangement of a natural monolayer superlattice of InGaP in the ordered state.
Figure 13:
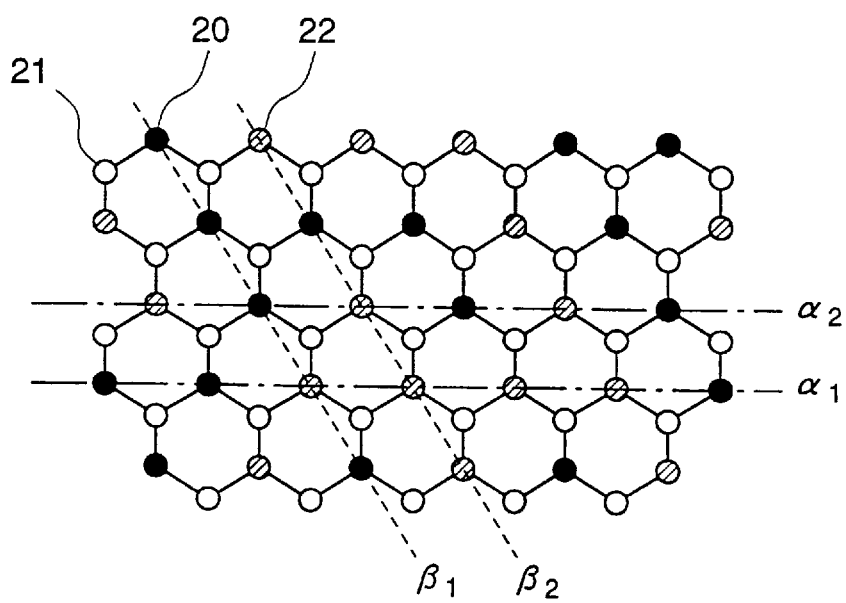
FIG. 13 is a diagram illustrating an atomic arrangement of a natural superlattice of InGaP in the disordered state.
Figure 14:
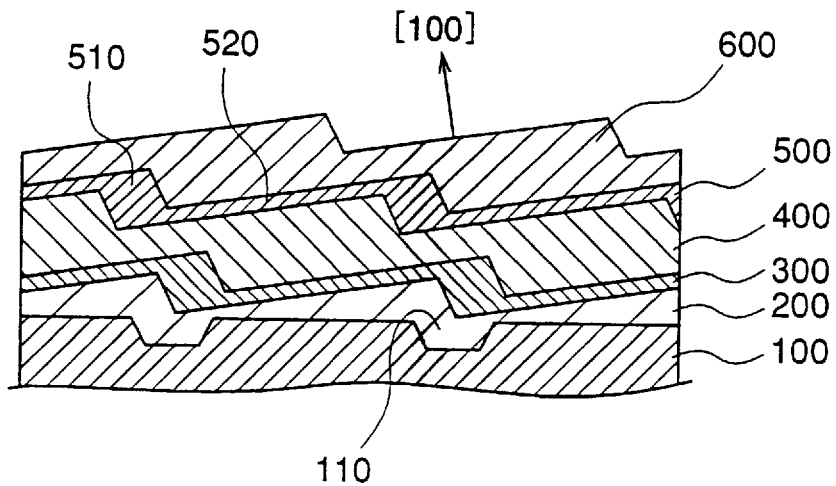
FIG. 14 is a cross-sectional view illustrating a quantum wire structure according to the prior art.
Figure 15:
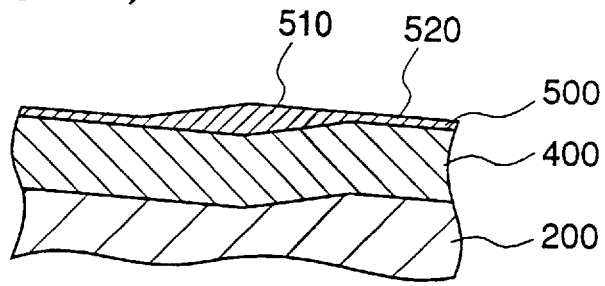
FIG. 15 is a cross-sectional view illustrating a quantum wire structure according to the prior art.

FIGS. 12 and 13 schematically show atomic arrangements of natural monolayer superlattice structures of InGaP. FIG. 12 shows a highly ordered natural monolayer superlattice wherein Ga atoms 20, P atoms 21, and In atoms 22 are regularly ordered. That is, in the directions of $\alpha_1$ and $\alpha_2$ shown by dashed lines, Ga atoms 20 and In atoms 22 are alternatingly arranged. In the directions of $\beta_1$ and $\beta_2$ shown by dotted lines, Ga atoms and In atoms are arranged, respectively, and the Ga line $\beta_1$ and the In line $\beta_2$ are alternatingly arranged. This state is called an ordered state, and the band gap energy of the compound semiconductor is low in the ordered state. On the other hand, FIG. 13 shows a poorly ordered natural monolayer superlattice wherein Ga atoms 20 and In atoms 22 are not arranged periodically. That is, in the directions of $\alpha_1$ and $\alpha_2$, Ga atoms 20 and In atoms 22 are not alternatingly arranged, i.e., are disordered, whereby the Ga line $\beta_1$ and the In line $\beta_2$ are also disordered. This state is called a disordered state, and the band gap energy is high in the disordered state.

The degree of order of a natural monolayer superlattice depends on the crystal growth condition. Especially, it is responsive to the surface orientation of a substrate on which the crystal growth occurs. Therefore, it is possible to periodically vary a degree of order of the natural monolayer superlattice grown on the substrate by periodically varying the surface orientation of the substrate. As a result, the band gap energy of the crystalline layer can be periodically varied within the crystalline layer.

The above-mentioned step bunching is described in Extended Abstracts (The 42nd Spring Meeting, 1995), The Japan Society of Applied Physics and Related Societies, Nos. 29a-SZY-9 and 29a-SZY-10. In the literature No. 29a-SZY-10, GaAs is grown on a GaAs substrate having a surface in a plane that is 2° off the (001) plane in the [110] direction at different growth temperatures, 600° C. and 700° C. The growth rate is 0.57~2.28 [nm/s], and the $ASH_3$ partial pressure is $1.3+10^{-4}$ [atm]. As a result of the growth of GaAs, step bunching occurs, i.e., atomic layer steps are bunched, and steps are formed at the surface of the GaAs layer. The step interval (terrace width) and the growth condition have the following relationship. When the GaAs layers grown at 600° C. and 700° C. are compared, the step interval is wider in the GaAs layer grown at 700° than in the GaAs layer grown at 600°. That is, the step interval has a tendency to increase with an increase in the growth temperature. When the growth temperature is 700° C., the step interval has a tendency to decrease with a reduction in the growth rate. Furthermore, it is described in the literature No. 29a-SZY-9 that the step bunching easily occurs when the growth temperature is high and the off angle of the substrate is large.

Figure 11:
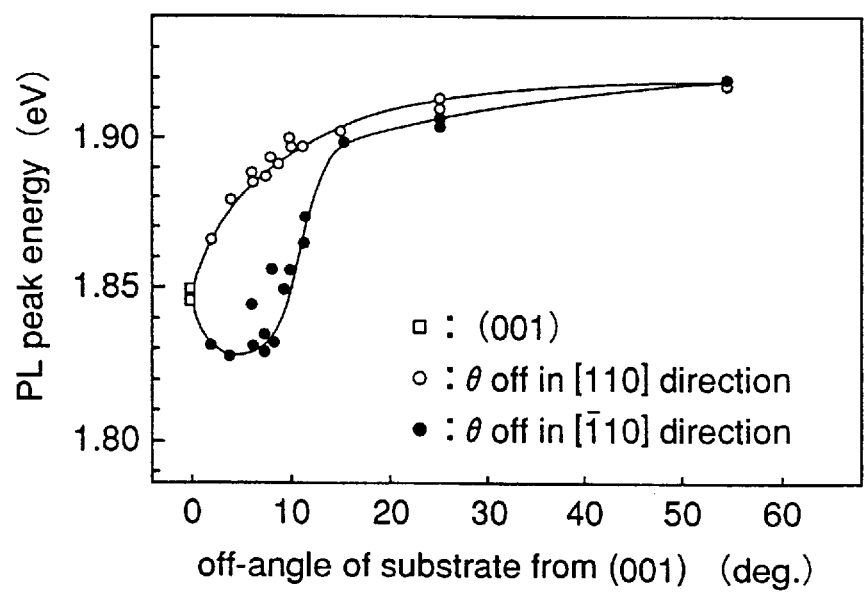
FIG. 11 is a graph illustrating the relationship between band gap energy of InGaP grown by MOCVD and surface orientation of a substrate on which InGaP is grown.

A description is given of the relationship between surface orientation, i.e., off angle, of a substrate and band gap energy of a crystalline layer grown on the surface of the substrate. FIG. 11 is a graph illustrating the relationship between PL peak energy and substrate off angle from the (001) plane when InGaP is grown by MOCVD, which is disclosed in Extended Abstracts (The 38th Spring Meeting, 1991), The Japan Society of Applied Physics and Related Societies, No. 30a-ZG-5. In the figure, white squares denote a substrate having a (001) surface orientation, that is, a substrate having an off angle of 0°. White circles denote substrates having off angles from the (001) plane in the [110] direction and black circles denote substrates having off angles from the (001) plane in the [$\bar{1}$10] direction. As can be seen from FIG. 11, the band gap energy of an InGaP layer grown on the (001) surface is within a range from 1.846 to 1.85 eV. However, when the surface of the substrate is off the (001) plane in the [110] direction, the band gap energy of the InGaP layer exceeds 1.85 eV and increases with an increase in the off angle of the substrate because the natural monolayer superlattice in the InGaP layer is increasingly disordered with an increase in the off angle.

On the other hand, when the surface of the substrate is about 8° off the (001) plane in the [$\bar{1}$10] direction, the band gap energy of the InGaP layer is lower than 1.85 eV because the order of the natural monolayer superlattice in the InGaP layer is improved. When the off angle is 4°~6°, the band gap energy takes the minimum value, about 1.83 eV. When the off angle exceeds 8°, the band gap energy exceeds 1.85 eV and increases with an increase in the off angle because the natural monolayer superlattice is disordered. When the off angle exceeds 15°, the energy band gap in case where the substrate off direction is [110] coincides with the energy band gap in case where the substrate off direction is [110].

Therefore, when the surface orientation of the substrate is varied so that the (001) plane and the plane that is off from the (001) plane in the [110] direction are periodically and alternatingly arranged, the natural monolayer superlattice of the InGaP layer grown on the substrate is highly ordered on the (001) plane and disordered on the off plane. Therefore, the band gap energy of the InGaP layer is lower on the (001) plane than on the off plane. In this case, charge carriers are confined in portions of the InGaP layer on the (001) plane having a band gap energy smaller than that of portions on the off plane, whereby the charge carriers can move freely only in the portions on the (001) plane.

On the other hand, when the surface orientation of the substrate is varied so that the (001) plane and the plane that is more than 8° off the (001) plane in the [$\bar{1}$10] direction are periodically and alternatingly arranged, the band gap energy of the InGaP layer grown on this substrate is similar to the above-mentioned band gap energy, and charge carriers are confined in portions of the InGaP layer on the (001) plane. However, when the off angle of the substrate is less than 8°, since the natural monolayer superlattice of the InGaP layer grown on the (001) plane is highly ordered, the band gap energy of the InGaP layer is reversed and charge carriers are confined in portions of the InGaP layer on the plane that is off the (001) plane in the [$\bar{1}$10] direction.

A description is given of the operation of the semiconductor device according to the first embodiment of the invention.

In the structure shown in FIG. 1, in the direction perpendicular to the surface of the substrate 1, because of a difference in band gap energies between AlGaInP and InGaP, charge carriers are confined in the InGaP layer 4 that is between the AlGaInP layers 3 and 5 having a relatively high band gap energy. In the InGaP layer 4, since the degree of order of the natural monolayer superlattice is varied periodically, charge carriers are confined in the portions 41 on the first crystal planes 31, i.e., the (001) planes, in the [110] direction. Since the portions 41 on the first crystal planes 31 extend in the direction perpendicular to the cross-section of FIG. 1, charge carriers move freely only in this direction. Therefore, a semiconductor device in which charge carriers are conducted one-dimensionally is realized. Furthermore, in the InGaP layer 4, since the portions 41 are between the portions 42 having a relatively high band gap energy, satisfactory quantum confinement of charge carriers in the portions 41 is realized, resulting in a semiconductor device in which the portions 41 serve as high-performance quantum wires.

Furthermore, since a substrate having no pattern is employed as the substrate 1, the density of the quantum wires within the surface of the substrate is increased, and the fabrication process is simplified.

[Embodiment 2]

Figure 3:
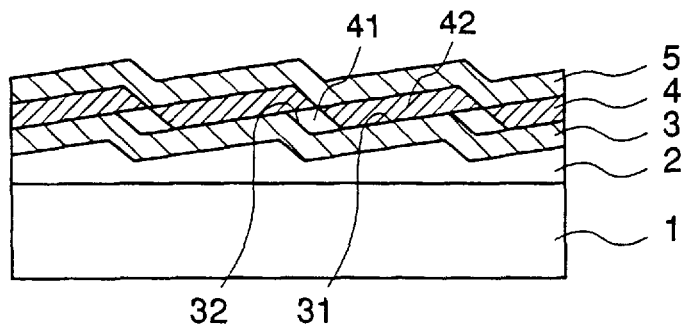
FIG. 3 is a cross-sectional view illustrating a quantum wire structure according to a second embodiment of the present invention.
Figure 4:
FIGS. 4(a)–4(e) are cross-sectional views illustrating process steps in a method of fabricating the quantum wire structure shown in FIG. 3.
Figure 4:
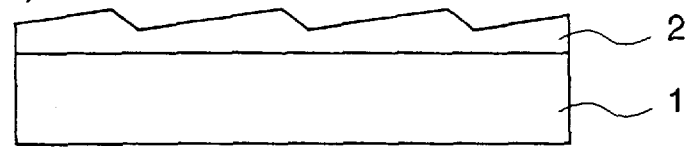
Figure 4:
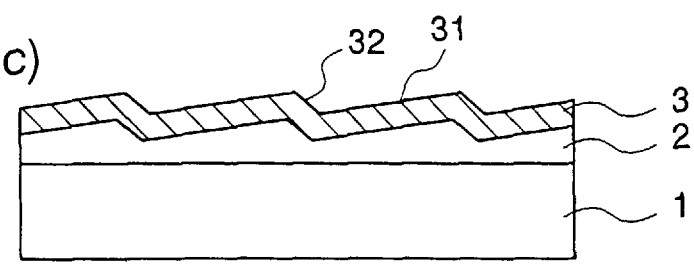
Figure 4:
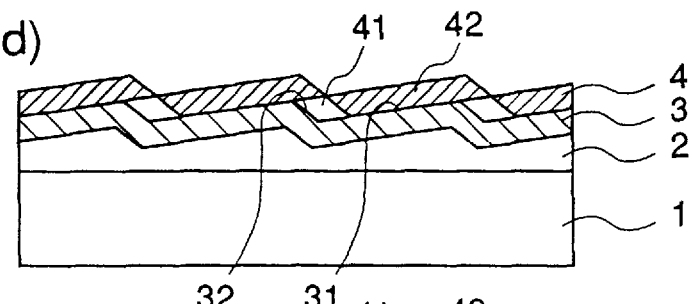
Figure 4:
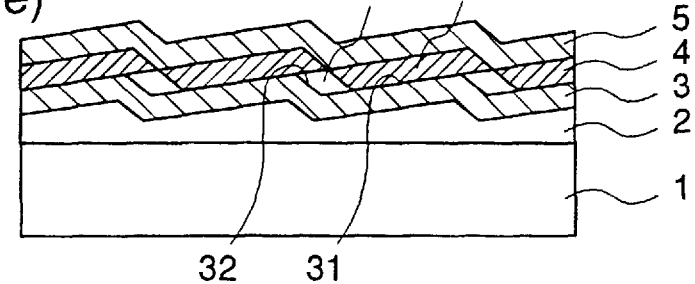

FIG. 3 is a cross-sectional view illustrating a quantum wire structure in accordance with a second embodiment of the present invention. In the figure, the same reference numerals as those shown in FIG. 1 designate the same or corresponding parts. The semiconductor device according to this second embodiment employs a GaAs substrate 1 having a surface in a plane that is 3°~5° off the (001) plane in the [$\bar{1}$10] direction. In addition, the AlGaInP layer 3 has a plurality of steps at the surface, and each step is formed between the (001) plane (first crystal plane 31) and a plane that is 5°~7° off the (001) plane in the [$\bar{1}$10] direction (second crystal plane 32). The degree of order of the natural monolayer superlattice in the InGaP layer 4 serving as a conduction layer is lower in portions 42 on the first crystal planes 31 than in portions 41 on the second crystal planes 32, in contrast to that of the semiconductor device according to the first embodiment of the invention.

FIGS. 4(a)–4(e) are cross-sectional views illustrating process steps in a method of fabricating the quantum wire structure shown in FIG. 3. The cross-section is viewed from the <$\bar{1}$10> direction perpendicular to the [110] direction.

Initially, a GaAs substrate 1 having a surface in a crystal plane that is 3°~5° off the (001) plane in the [$\bar{1}$10] direction is prepared (FIG. 4(a)). Then, semiconductor layers are successively grown on the surface of the GaAs substrate 1 by MOCVD. First of all, a GaAs layer 2 is grown on the surface of the substrate 1 at a temperature of 600° C. (FIG. 4(b)). In this crystal growth, atomic layer steps on the surface of the substrate 1 are bunched to produce multiatomic steps at the surface of the GaAs layer 2. As a result, the GaAs layer 2 has a surface configuration in which the (001) plane and a plane that is 5°~7° off the (001) plane in the [$\bar{1}$10] direction are periodically arranged. These two planes having different orientations and produced by the multiatomic steps extend straight in the direction perpendicular to the cross section of the figure. Although the GaAs layer 2 is grown at 600° C., the growth temperature is not restricted thereto.

In the step of FIG. 4(c), $Al_{0.25}Ga_{0.25}In_{0.5}P$ is grown on the GaAs layer 2 at a temperature of 650° C. to produce an AlGaInP first barrier layer 3 that lattice-matches with the GaAs substrate 1. The AlGaInP layer 3 has a surface configuration basically identical to the surface configuration of the GaAs layer 2. More specifically, the AlGaInP layer 3 has a surface configuration in which the (001) plane (first crystal plane 31) and the plane that is 5°~7° off the (001) plane in the [$\bar{1}$10] direction (second crystal plane 32) are periodically arranged.

In the step of FIG. 4(d), $In_{0.5}Ga_{0.5}P$ is grown on the AlGaInP layer 3 at a temperature of 660° C. and a V/III ratio of 140 to produce an InGaP conduction layer 4. In the InGaP layer 4, a natural monolayer superlattice in which Ga atoms and In atoms are arranged regularly is produced. The band gap energy of the InGaP layer 4 is smaller than the band gap energy of the AlGaInP layer 3. The degree of order of the natural monolayer superlattice is lower in portions 42 on the first crystal planes 31 than in portions 41 on the second crystal planes 32. Therefore, the band gap energy of the portions 42 of the InGaP layer 4 on the first crystal planes 31 is larger than the band gap energy of the portions 41 on the second crystal planes 32. The growth conditions of the InGaP layer 4 are not restricted to those described above.

Finally, $Al_{0.25}Ga_{0.25}In_{0.5}P$ is grown on the InGaP layer 4 at a temperature of 650° C. to produce an AlGaInP layer 5 having a band gap energy larger than the band gap energy of the InGaP layer 4, completing an AlGaInP/InGaP/AlGaInP quantum well structure (FIG. 4(e)).

A description is given of the operation.

In the structure shown in FIG. 3, in the direction perpendicular to the surface of the substrate 1, because of a difference in band gap energies between AlGaInP and InGaP, charge carriers are confined in the InGaP layer 4 that is between the AlGaInP layers 3 and 5 having a relatively high band gap energy. In the InGaP layer 4, since the degree of order of the natural monolayer superlattice is varied periodically, charge carriers are confined in the portions 41 on the second crystal planes 32 that are off the (001) plane in the [$\bar{1}$10] direction.

Figure 10:
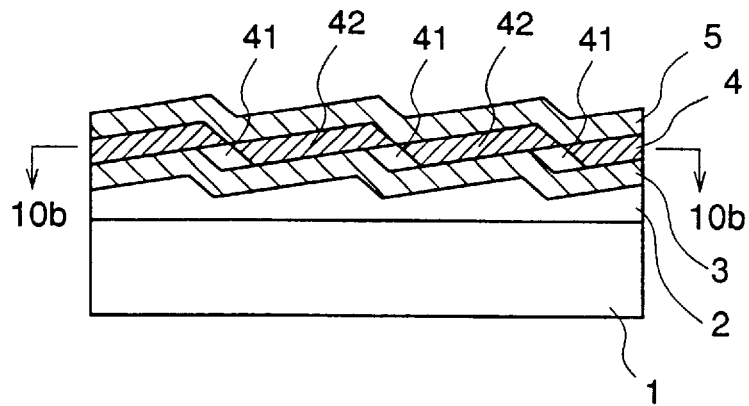
FIGS. 10(a)–10(b) are a cross-sectional view and an energy band diagram, respectively, for explaining an energy band structure of an InGaP layer in the quantum wire structure shown in FIG. 3.
Figure 10:
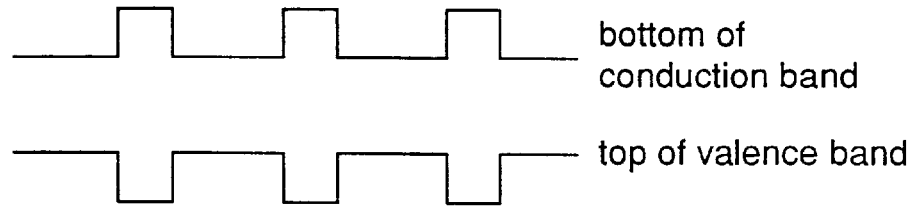

FIG. 10(a) is a cross-sectional view of a quantum wire structure according to the second embodiment of the invention, and FIG. 10(b) is an energy band diagram of an InGaP layer 4 at a cross section taken along line 10b–10b in FIG. 10(a). As shown in FIG. 10(b), both the bottom of the conduction band and the top of the valence band are shifted toward the lower energy side in the portions 41 in which the degree of order of the natural monolayer superlattice is high, compared to the portions 42 in which the degree of order of the natural monolayer superlattice is low. That is, charge carriers are confined in the portions 41 of the InGaP layer 4, whereby a quantum wire structure is realized.

Furthermore, since the portions 41 extend in the direction perpendicular to the cross section of FIG. 3, the confined charge carriers can move freely only in this direction. As a result, a semiconductor device in which charge carriers are conducted one-dimensionally is realized.

As described above, according to the second embodiment of the present invention, in the conduction layer 4, charge carriers are satisfactorily confined in the portions 41 by the portions 42 on the (001) plane and having a band gap energy larger than that of the portions 41, in the direction of the alternating arrangement of the portions 41 and the portions 42. As a result, a semiconductor device in which the portions 41 of the conduction layer 4 function as high-performance quantum wires is realized.

Furthermore, since there is no patterning of the substrate 1, the density of the wires within the surface of the substrate 1 can be increased. In addition, the fabrication process can be simplified.

The same effects as provided by the first and second embodiments of the invention are achieved in a similar structure including an AlInAs conduction layer 4. In this case, AlAsSb having a band gap energy larger than that of AlInAs is used for the barrier layers 3 and 5 that sandwich the AlInAs conduction layer 4. Further, in this case, an InP substrate that lattice matches with AlInAs/AlAsSb is preferable to a GaAs substrate.

In regard to a natural monolayer superlattice of a crystalline AlInAs layer, described in Extended Abstracts (The 41st Spring Meeting, 1994), The Japan Society of Applied Physics and Related Societies, No. 28a-Y-10 a surface rearrangement structure takes the initiative in the crystal growth, and atomic steps on the substrate perform an important part. That is, when atomic steps are present on a crystal plane on which AlInAs is grown, AlInAs grown on that plane forms a natural monolayer superlattice.

Meanwhile, the relationship between the band gap energy of AlInAs and the degree of order of a natural superlattice in AlInAs is described in Extended Abstracts (The 40th Autumn Meeting, 1993), The Japan Society of Applied Physics and Related Societies, No.27p-ZS-9. In this literature, AlInAs is grown on an inclined substrate by gas source MBE at different growth temperatures of 415° C., 460° C., 520° C., and 570° C. As a result of the experiment, it is found that a reduction in the band gap energy of AlInAs due to the formation of the natural monolayer superlattice is encouraged with a reduction in the growth temperature. That is, the band gap energy is reduced with an increase in the degree of order of the natural monolayer superlattice in AlInAs.

While in the first and second embodiments of the invention InGaP is employed for the one-dimensional conduction layer 4, AlGaInP may be employed with the same effects as provided by the first and second embodiments. In this case, AlGaInP having an Al composition larger than that of the AlGaInP conduction layer 4 is employed for the barrier layers 3 and 5 that sandwich the conduction layer 4.

[Embodiment 3]

Figure 5:
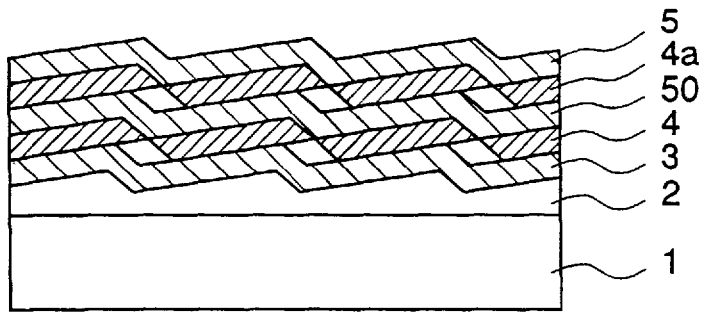
FIG. 5 is a cross-sectional view illustrating a quantum wire structure, according to a third embodiment of the present invention.

FIG. 5 is a cross-sectional view illustrating a two-stage quantum wire structure in accordance with a third embodiment of the present invention. In this third embodiment, two quantum wire structures are laminated in the direction perpendicular to the surface of the substrate. The fabrication process of the two-stage quantum wire structure is identical to the fabrication process already described with respect to FIGS. 4(a)-4((e) except that an AlGaInP layer 50 having a band gap energy larger than that of the InGaP layer 4 is grown on the InGaP layer 4 by MOCVD, and a second InGaP layer 4a is grown on the AlGaInP layer 50. This two-stage quantum wire structure further increases the density of the quantum wires within the surface of the substrate.

Although a two-stage quantum wire structure is described in this third embodiment, the number of the quantum wire stages is not restricted to two

[Embodiment 4]

Figure 6:
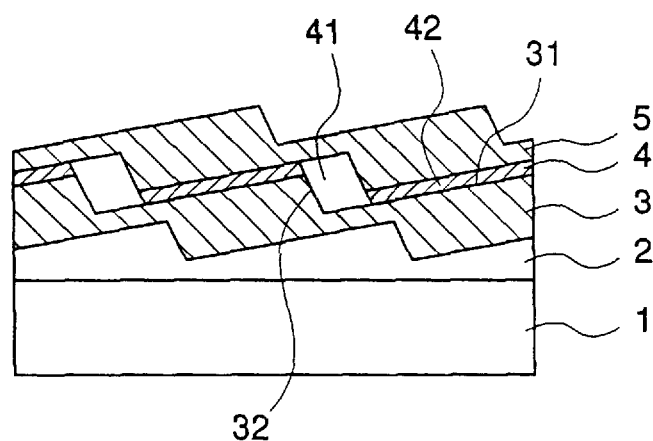
FIG. 6 is a cross-sectional view illustrating a quantum wire structure according to a fourth embodiment of the present invention.

FIG. 6 is a cross-sectional view illustrating a quantum wire structure in accordance with a fourth embodiment of the present invention. In this fourth embodiment, the InGaP layer 4 serving as a conduction layer is thicker on the second crystal plane 32 than on the first crystal plane 31, that is, the portions 41 on the 5°~7° off (001) plane 32 are thicker than the portions 42 on the (001) plane 31. The portion 41 is about 0.3 $\mu$m thick, and the portion 42 is about 0.1 $\mu$m thick. The InGaP layer 4 is grown by MOCVD at a growth temperature of about 750° C. The growth temperature is not restricted thereto.

In this fourth embodiment of the invention, in addition to the difference in the degree of order of the natural superlattice of the InGaP layer 4 between the portions 41 and the portions 42, the portions 41 are thicker than the portions 42. Therefore, the effect of confining charge carriers in the portions 41 is further improved.

[Embodiment 5]

Figure 7:
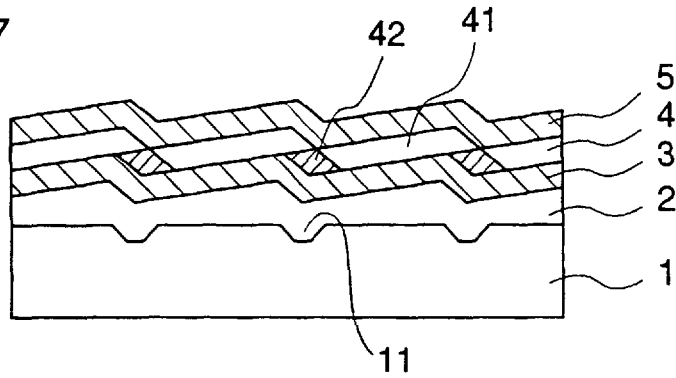
FIG. 7 is a cross-sectional view illustrating a quantum wire structure according to a fifth embodiment of the present invention.

FIG. 7 is a cross-sectional view illustrating a quantum wire structure in accordance with a fifth embodiment of the invention. The structure and the fabrication process according to this fifth embodiment are identical to those already described with respect to the first embodiment except that a GaAs substrate 1 having a periodic pattern of grooves 11 is employed. The interval between adjacent grooves 11 ranges from several microns to several tens of microns. The grooves 11 are formed at the surface of the GaAs substrate 1 by etching or the like. Also in this case, a high-performance quantum wire structure in which charge carriers are conducted one-dimensionally in the highly-ordered superlattice portions 41 of the conduction layer 4, is obtained.

[Embodiment 6]

Figure 8:
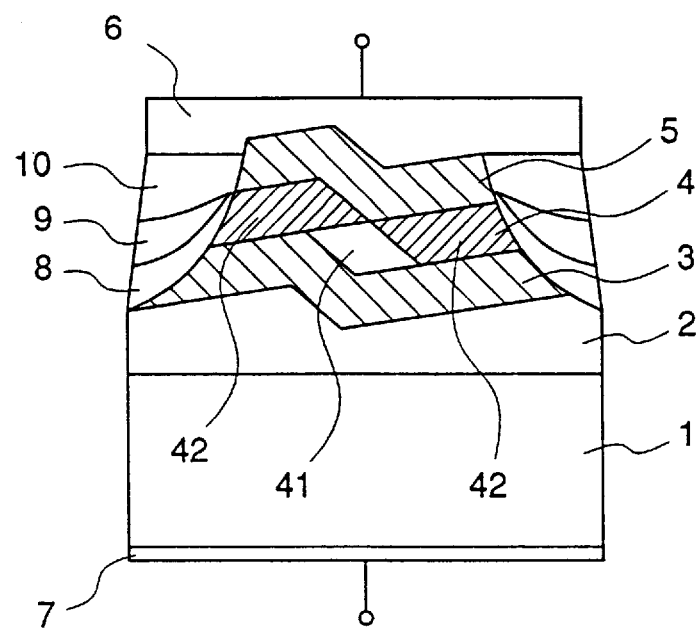
FIG. 8 is cross-sectional view illustrating a semiconductor laser employing the quantum wire structure shown in FIG. 3, according to a sixth embodiment of the present invention.

FIG. 8 is a cross-sectional view illustrating a semiconductor laser including a quantum wire structure as described with respect to the second embodiment of the invention, according to a sixth embodiment of the invention. In FIG. 8, the same reference numerals as those shown in FIG. 3 designate the same or corresponding parts. Reference numerals 6 and 7 designate a p side electrode and an n side electrode, respectively. Reference numerals 8, 9, and 10 designate a p type AlGaAs layer, an n type AlGaAs layer, and a p type AlGaAs layer, respectively.

In the fabrication process, after formation of the quantum wire structure as shown in FIG. 4(e), portions of the structure at both sides of each quantum wire 41 are etched and removed to form a ridge that comprises the AlGaInP layer 3, the InGaP layer 4, and the AlGaInP layer 5 and has the quantum wire 41 in the center. Thereafter, a p type AlGaAs layer 8, an n type AlGaAs layer 9, and a p type AlGaAs layer 10 are grown on both sides of the ridge. Finally, a p side electrode 6 is formed on the AlGaInP layer 5 and on the AlGaAs layer 10, and an n side electrode 7 is formed on the rear surface of the substrate 1, preferably by vacuum evaporation, completing a semiconductor laser.

In this semiconductor laser, when charge carriers are injected into the InGaP layer 4 serving as an active layer, since the band gap energy of the portion 41 where the natural monolayer superlattice is highly ordered is lower than the band gap energy of the portions 42 where the natural monolayer superlattice is disordered, the charge carriers are confined within the portion 41 with high reliability. As a result, a high-performance semiconductor laser that can oscillate at a low current density is realized.

In this sixth embodiment of the invention, a quantum wire structure according to the second embodiment is applied to a semiconductor laser device. However, a similar laser device including a quantum wire structure according to the first embodiment is also within the scope of the invention. Further, a quantum wire structure according to the first embodiment or the second embodiment may be applied to a semiconductor laser array having a plurality of laser oscillation regions. In this case, the portions 41 of the conduction layer 4 wherein the superlattice is highly ordered, i.e., the quantum wires, become the laser oscillation regions of the laser array.

[Embodiment 7]

Figure 9:
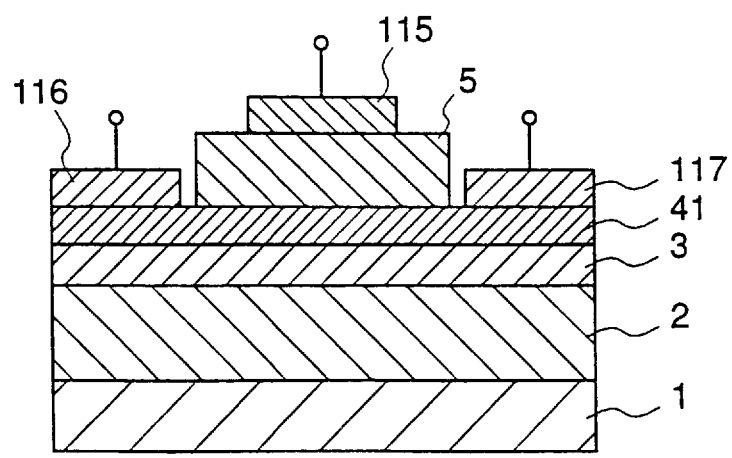
FIG. 9 is a cross-sectional view illustrating a field effect transistor employing the quantum wire structure shown in FIG. 1, according to a seventh embodiment of the present invention.

FIG. 9 is a cross-sectional view illustrating a field effect transistor in accordance with a seventh embodiment of the present invention. This cross-sectional view is parallel to the longitudinal direction of the portion 41 of the GaInP layer 4 shown in FIG. 1. In the figure, the same reference numerals as those shown in FIG. 1 designate the same or corresponding parts. Reference numerals 115, 116, and 117 designate a gate electrode, a source electrode, and a drain electrode, respectively. In the fabrication, after formation of the quantum wire structure shown in FIG. 2(e), portions of the AlGaInP layer 5 opposite the portion 41 are etched and removed to form openings wherein a source electrode 116 and a drain electrode 117 are later produced. Thereafter, a source electrode 116 and a drain electrode 117 are formed in the openings, contacting the portion 41, and, simultaneously, a gate electrode 115 is formed on the AlGaInP layer 5 between the openings. Preferably, these electrodes are formed by vacuum evaporation.

In this field effect transistor, since the band gap energy of the portion 41 of the InGaP layer 4 is smaller than the band gap energy of the portions 42 (not shown) on both sides of the portion 41, charge carriers can move only in the portion 41. So, when the source electrode 116 and the drain electrode 117 are formed along the longitudinal direction of the portion 41, a one-dimensional channel region is realized by the portion 41. As a result, a field effect transistor with a high electron mobility is realized.

In this seventh embodiment of the invention, a quantum wire structure according to the first embodiment is applied to a field effect transistor. However, a similar structure employing a quantum wire structure according to the second embodiment is also within the scope of the invention. In this case, a source electrode, a drain electrode, and a gate electrode are formed opposite the portion 41 on the second crystal plane 32 shown in FIG. 3.

What is claimed is:

1. A semiconductor device comprising:
   a semiconductor substrate having opposed first and second surfaces; and
   a compound semiconductor laminated structure comprising a first barrier layer, a conduction layer including first and second different elements from a first Group of the Periodic Table of Elements and having a natural monolayer superlattice, and a second barrier layer, disposed on the first surface of the semiconductor substrate, the first barrier layer, the conduction layer, and the second barrier layer producing heterojunctions that confine charge carriers within the conduction layer perpendicular to the first surface of the substrate, wherein
   the first barrier layer has a plurality of steps at a surface contacting the conduction layer, the steps including, alternatingly arranged, a first crystal plane having a first orientation and a second crystal plane having a second orientation different from the first orientation, and
   the conduction layer comprises first portions in which the natural monolayer superlattice is ordered and second portions in which the natural monolayer superlattice is disordered, the first portions and the second portions being disposed on the first crystal plane and the second crystal plane, respectively, the first portions functioning as quantum wires.

2. The semiconductor device of claim 1 wherein the semiconductor substrate has a first surface that is off from a crystal plane toward another crystal plane.

3. The semiconductor device of claim 1 wherein the first barrier layer and the second barrier layer comprise AlGaInP having an Al composition, and the conduction layer is selected from the group consisting of InGaP and AlGaInP and having an Al composition smaller than the Al composition of the AlGaInP of the first and second barrier layers.

4. The semiconductor device of claim 1 wherein the first barrier layer and the second barrier layer comprise AlAsSb, and the conduction layer comprises AlInAs.

5. The semiconductor device of claim 1 wherein the conduction layer includes a plurality of stages perpendicular to the first surface of the substrate.

6. The semiconductor device of claim 1 wherein the first portions of the conduction layer are thinner than the second portions of the conduction layer.

7. The semiconductor device of claim 1 wherein the semiconductor substrate has grooves in the first surface.

8. The semiconductor device of claim 1 comprising a first electrode disposed on the second surface, and a second electrode disposed on the second barrier layer.

9. The semiconductor device of claim 1 comprising:
   a source electrode and a drain electrode disposed on one of the first portions of the conduction layer; and
   a gate electrode disposed on a part of the second barrier layer between the source electrode and the drain electrode.

10. The semiconductor device of claim 1 wherein the first surface lies in a crystal plane off the (001) plane in the [110] direction, the first crystal plane is the (001) plane, and the second crystal plane is off the (001) plane in the [110] direction.

11. The semiconductor device of claim 1 wherein the first surface lies in a crystal plane off the (001) plane in the [$\bar{1}$10] direction, the first crystal plane is the (001) plane, and the second crystal plane is off the (001) plane in the [$\bar{1}$10] direction.

* * * * *

UNITED STATES PATENT AND TRADEMARK OFFICE
CERTIFICATE OF CORRECTION

PATENT NO.    : 5,886,360
DATED         : March 23, 1999
INVENTOR(S)   : SEIJI OCHI It is certified that error appears in the above-identified patent and that said Letters Patent is hereby corrected as shown below:

Column 14, line 23, after "off" insert --axis--;

change "a" (second occurrence) to --one--.

Signed and Sealed this

Seventh Day of September, 1999

Attest:

Q. TODD DICKINSON

*Attesting Officer*    *Acting Commissioner of Patents and Trademarks*